United States Patent [19]

Galvagni

[11] 4,010,579
[45] Mar. 8, 1977

[54] THREE DIMENSIONAL PRE-FABRICATED STRUCTURAL ELEMENTS FOR BUILDING HABITATION UNITS

[76] Inventor: Mario Galvagni, via Leonida Bissolati 22, Milan, Italy

[22] Filed: Sept. 29, 1975

[21] Appl. No.: 617,503

Related U.S. Application Data

[63] Continuation-in-part of Ser. No. 452,668, March 19, 1974, abandoned.

[52] U.S. Cl. .................................. 52/79.8; 52/234; 52/79.9; 52/227
[51] Int. Cl.² ...................... E04H 9/06; E04C 3/10
[58] Field of Search ...... 52/234, 236, 79, 227–229, 52/583, 587

[56] References Cited

UNITED STATES PATENTS

| | | | |
|---|---|---|---|
| 1,998,448 | 4/1935 | Crowe | 52/587 |
| 2,408,133 | 9/1946 | Abel | 52/583 |
| 2,691,291 | 10/1954 | Henderson | 52/236 |
| 2,920,475 | 1/1960 | Graham | 52/587 |
| 3,462,908 | 8/1969 | Wysocki | 52/79 |
| 3,587,197 | 6/1971 | Renfro | 52/236 |
| 3,694,977 | 10/1972 | Verman | 52/236 |
| 3,822,569 | 9/1974 | Lautrup-Larsen | 52/79 |
| 3,881,571 | 5/1975 | Moulton | 52/79 |

FOREIGN PATENTS OR APPLICATIONS 1,526,601  4/1968  France ........................... 52/583

Primary Examiner—James L. Ridgill, Jr.
Attorney, Agent, or Firm—Finnegan, Henderson, Farabow & Garrett

[57] ABSTRACT

Three dimensional pre-fabricated self-supporting elements, each being one-quarter portion of a room, are formed with a floor section, a ceiling section and at least two interposed wall sections.

These elements are integrally pre-formed with stiffening structural ribs or ribs shaped to provide support means for differently shaped pieces of furniture; with door and window apertures; with channel passages, pipe fittings and the like for receiving pipes and electrical wiring for utilities; and interengaging fitting means formed integrally on the outside of those floor, ceiling, and wall sections to fasten together the elements forming a room, or a number of rooms together to form residences of one or more floors.

1 Claim, 19 Drawing Figures

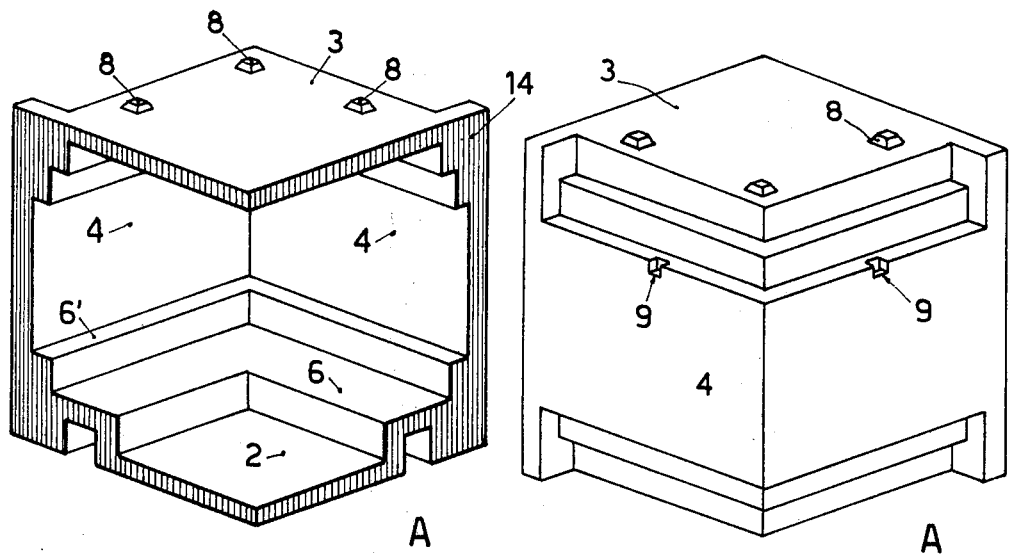
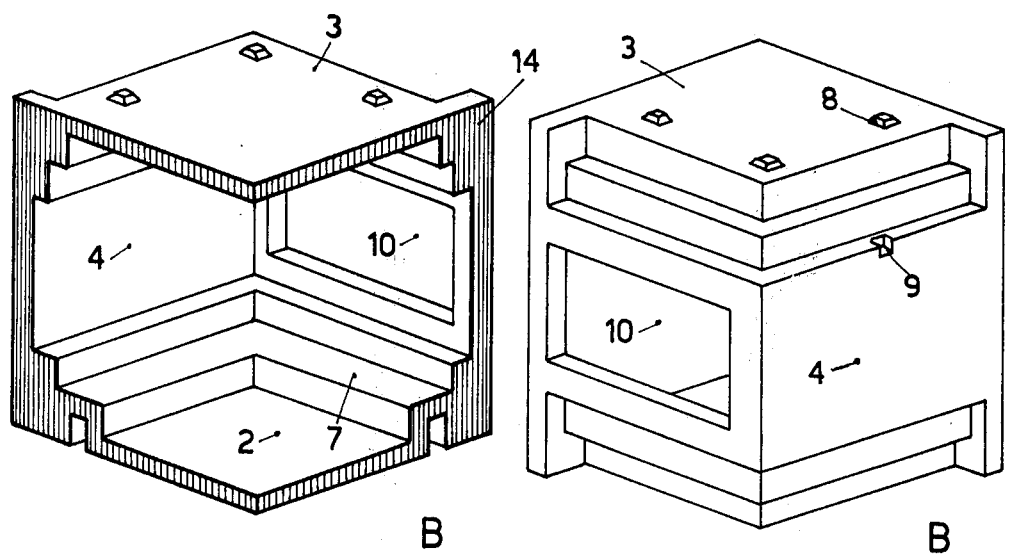

THREE DIMENSIONAL PRE-FABRICATED STRUCTURAL ELEMENTS FOR BUILDING HABITATION UNITS

This application is a continuation-in-part of prior application Ser. No. 452,668 filed Mar. 19, 1974 now abandoned.

BACKGROUND OF THE INVENTION

The present invention relates to three-dimensional pre-fabricated structural elements for building habitation units or residences.

It is known that in the last years, due to the ever-growing cost of labor in the building industry, some erecting yards have been reorganized to use prefabricated products to reduce the incidence of labor costs on the total cost of a house. Accordingly improved pre-fabricated structural elements have been designed for reducing the actual masonry work, by mainly reducing the number of fastening and sealing operations required for the set-up of such pre-fabricated elements.

However the solutions so far adopted have only partially solved the basic problems involving costs and time of manufacturing houses, which according to the social-economic requirements of each country, should be respectively low cost and short time for erection.

In the past, the pre-fabricated structural elements for the building industry have been to a great extent exemplified in substantially bi-dimensional structures which although they may have afforded some advantages concerning the manufacturing costs, nevertheless have left nearly unchanged the incidence of labour costs, due to the high number of operations which are necessary, such as assembling, welding, fastening, sealing, etc.

Three-dimensional pre-fabricated elements have also been designed and probably sometimes manufactured and employed for building residences in order to reduce the assembling costs. Such structural elements are disclosed and claimed, among others, in U.S. Pat. Nos. 3,587,197 to Renfro; 3,694,977 to Vernan; 3,775,919 to Fulton et al.

A method of erecting multistory buildings employing such three-dimensional elements is disclosed by U.S. Pat. No. 3,462,908 Wysocki.

Renfro Patent relates to a room structure in which a plurality of room modules is adapted to be cantilever supported from a center support means. Obviously there are transportability problems, due to the difficulty of carrying the full room sized modules from the factory to the erecting yard, as they are of large size and of different shape. U.S. Pat. No. 3,694,977 (Vernan) proposes the assembly of an entire floor in a modular row house by employing pre-fabricated units, which are each one-half of an entire floor, or two half-sections forming the rooms of each multiroom floor plan adapted to be joined together.

The transportability problems mentioned above can be partially solved by the structural elements made according to the above-mentioned U.S. Pat. No. 3,775,919, which are of smaller size, but this disclosure is accompanied by the inconvenience of and necessitating for providing a covering panel to be mounted on each element for completing a room.

However, all the structures according to the cited Patents and other known art do not allow to provide for the most efficient handling in relation with the manufacturing, transportation and assembling operations. Furthermore, such three-dimensional structures of the prior art are not self-supporting and need special arrangements and costly assembly operations when multistory building are to be erected, for the vertical securement of an upper element relative to a lower element.

SUMMARY OF THE INVENTION

It is an object of the present invention to provide three-dimensional pre-fabricated elements, each being a self-supporting one-quarter portion of a conventional room, adapted to be simply assembled habitation units, which give a most efficient solution, according to the possibilities of transportation, of the problem of prefabricated houses with reduced manufacturing costs.

Another object of the present invention is that of providing three-dimensional elements fully pre-fabricated having integrally built-in ribs which provide support means for differently shaped pieces of furniture, and/or being formed with window and door apertures.

A further object of the present invention is to provide three-dimensional pre-fabricated elements of standard size, adapted to be assembled together side by side by means of suitable fastening devices to form, with each group of four, a conventional room structure, such room structures being adapted to be mounted side by side or one on another in multistory buildings.

Still another object of the present invention is to provide three-dimensional pre-fabricated elements, each being a self-supporting one-quarter section of a room constructed and arranged to be selectively fitted together to form different types of rooms in a residential complex and being removable and then interchangeable with one another so that the design of an apartment and/or the function of the various rooms may be selectively rearranged and altered as desired.

A three-dimensional, pre-fabricated structural element according to the invention comprises a floor part and a ceiling part with two interposed wall parts formed integrally with said floor and ceiling parts, said floor parts and wall parts together defining a generally rectangular space; each of said elements forming a complete self-supporting standard size one-quarter portion of a conventional residential room; certain of said floor, ceiling and wall parts being integrally formed with stiffening ribs and certain of said wall parts having door and window apertures formed therein; other non-stiffening ribs being provided integral with said floor and wall parts, such other ribs being shaped to provide support means for differently shaped pieces of furniture; pre-formed passages being provided within said parts of an element to form channels for receiving pipes and electrical wiring for utilities; interengaging fitting means formed integrally on the outside of said floor, wall and ceiling parts, adapted to fasten together, in group of four, said elements being one-quarter portions of a conventional room, and such assembled rooms to form a residential complex; said interengaging fitting means being adapted to be readily disengaged and re-engaged, and said self-supporting standard size elements being constructed and arranged to be selectively fitted together to form different types of rooms in a residential complex, and being removable and then interchangeable with one another, whereby the residential pattern of rooms may be selectively rearranged and altered as desired.

BRIEF DESCRIPTION OF THE DRAWINGS

The present invention will be fully understood from the following detailed description of some preferred embodiments thereof, with reference to the annexed drawings, wherein:

FIG. 1 is a perspective view of the interior of a pre-fabricated element of the invention;

FIG. 2 is a perspective view of the outside of the element of FIG. 1;

FIG. 3 is a perspective view of the inside of another pre-fabricated element according to this invention;

FIG. 4 is a perspective outside view of the element of FIG. 3;

FIGS. 5–7–9 are each perspective views of the inside of further pre-fabricated elements of this invention;

FIGS. 6–8–10 are each perspective outside views of the elements of FIGS. 5–7–9 respectively;

FIGS. 11–13 are perspective inside views of other two embodiments of the present invention;

FIGS. 12–14 are perspective outside views of further two embodiments of the present invention;

DETAILED DESCRIPTION OF THE PREFERRED EMBODIMENTS

Figure 5:
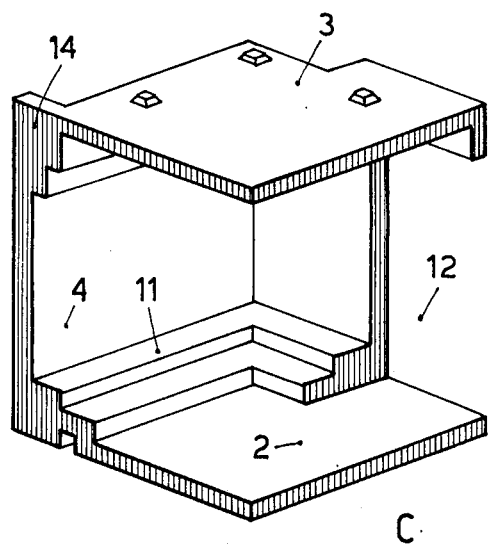

With reference to FIGS. 1 and 2, where A generally indicates the three-dimensional pre-fabricated element of the invention, 2 is a floor section, 3 a ceiling section and 4 are two wall sections. The pre-fabricated structural element A of FIGS. 1 and 2 is designed to provide a unit providing a divan-corner, having two ribs 6, 6' for supporting padded seats or cushions formed of resilient or expanded material. The exerior of the ceiling section 3 is provided with interengaging means including fitting means 8 for allowing the mutual superimposition of the three-dimensional elements of the invention, corresponding seats (not shown) being provided on the lower side of the floor section 2 (on the exterior). The walls 4 are formed at the outside with some recesses 9 adapted to be the seats of fastening means for assembling a plurality of pre-fabricated elements of the invention to form a room or join several assembled units together on the same floor level. The above-mentioned fitting and fastening means 8 is of a known type, such as retaining pins, iron or concrete joints, or plates to be welded.

The fastening means within the recesses 9 may conveniently be of the turnbuckle type, such as those shown at FIG. 17 and better described in the following.

FIGS. 3 and 4 show an element B substantially similar to that already described, but wherein the ribs 7 are, different from ribs 6, to make them more suitable to be the seats for a dining-table. Furthermore one of the walls has a wide aperture 10 adapted to form a window-space, possibly arranged to receive various types of pre-fabricated windows.

Figure 6:
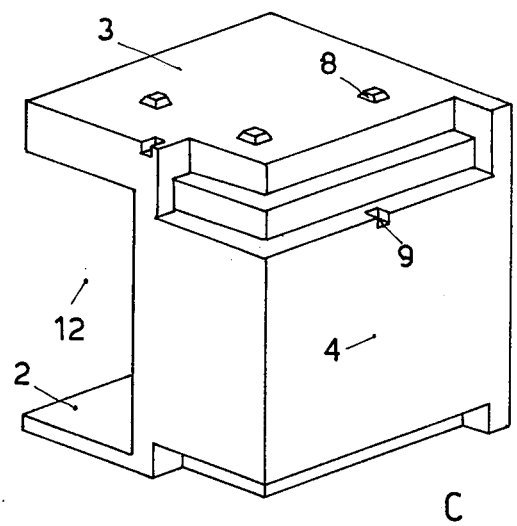

FIGS. 5 and 6 show a pre-fabricated element C, formed with ribs 11 adapted to be the support of a single bed (possibly tiltable). The space 12 shown both in FIG. 5 and 6, is adapted for mounting a balcony window or a door.

Analogously and similarly to what has been so far described, FIGS. 7, 8 and 9, 10 show inside and outside views of other embodiments of the pre-fabricated three-dimensional elements according to the invention, pre-arranged with suitable ribs 13, 16 for supporting respectively, a double bed and an auxiliary single bed (possibly tiltable).

Figure 7:
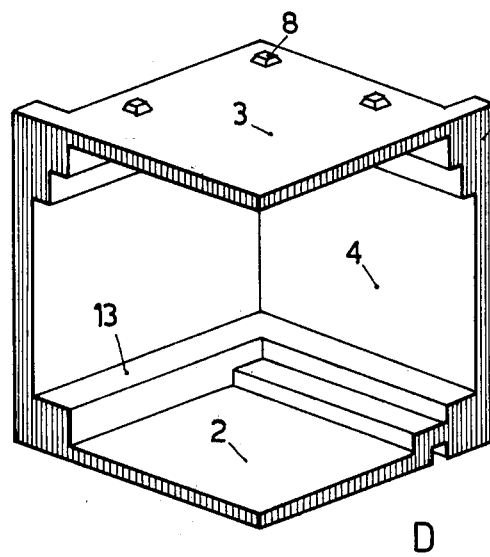
Figure 8:
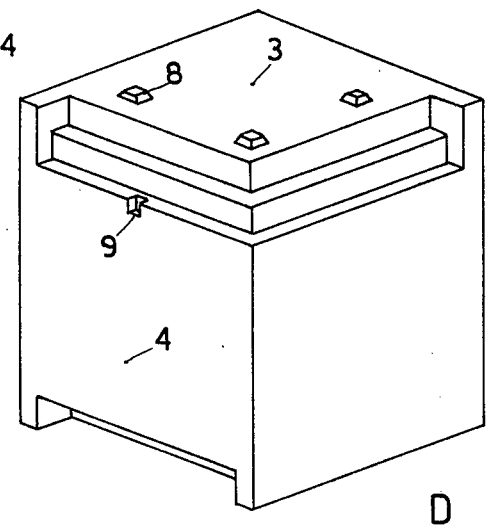

More specifically, the element D of FIGS. 7 and 8 provides for a better use of the room by shifting a bed mounted on wheels along a wall. The element E shown in FIGS. 9 and 10, has a window-space 15 and ribs 16 for supporting an auxiliary bed possibly tiltable).

Figures 9, 10:
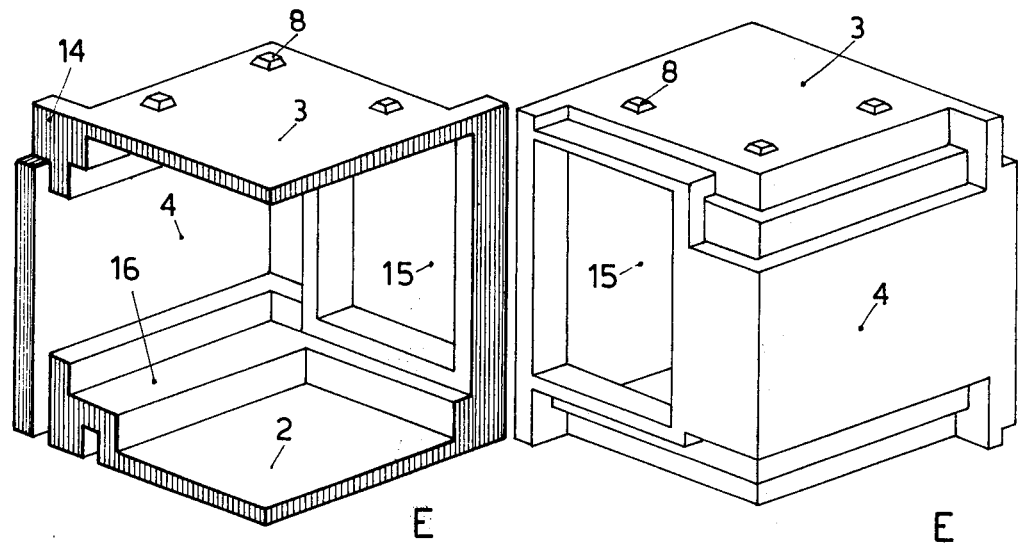
Figures 11, 12:
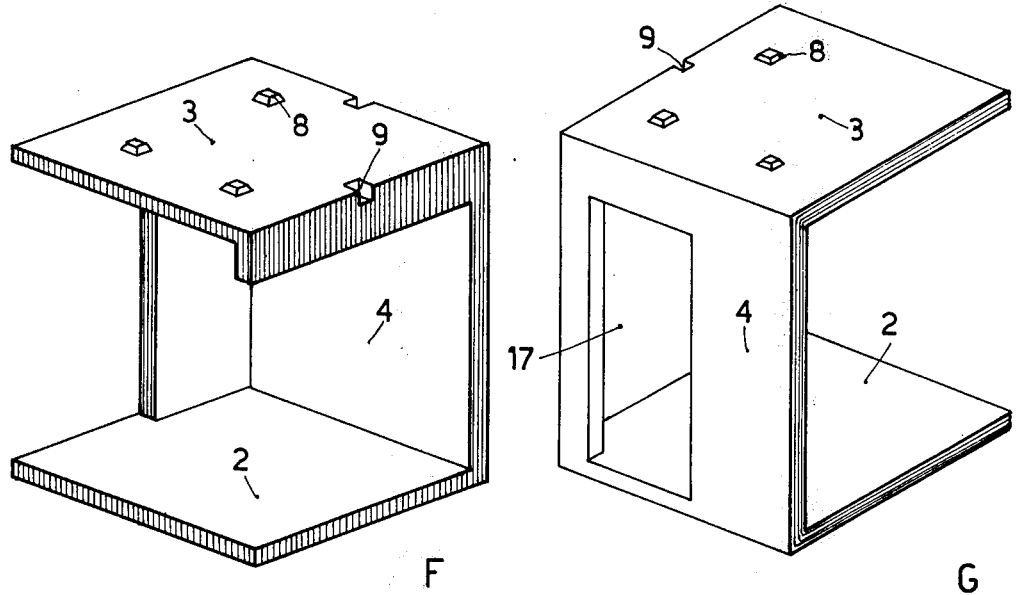

Pre-fabricated element F of FIG. 11 can be used for receiving a wardrobe or as a living-room, and it must be assembled with the elements of FIGS. 9 and 10.

Figures 13, 14:
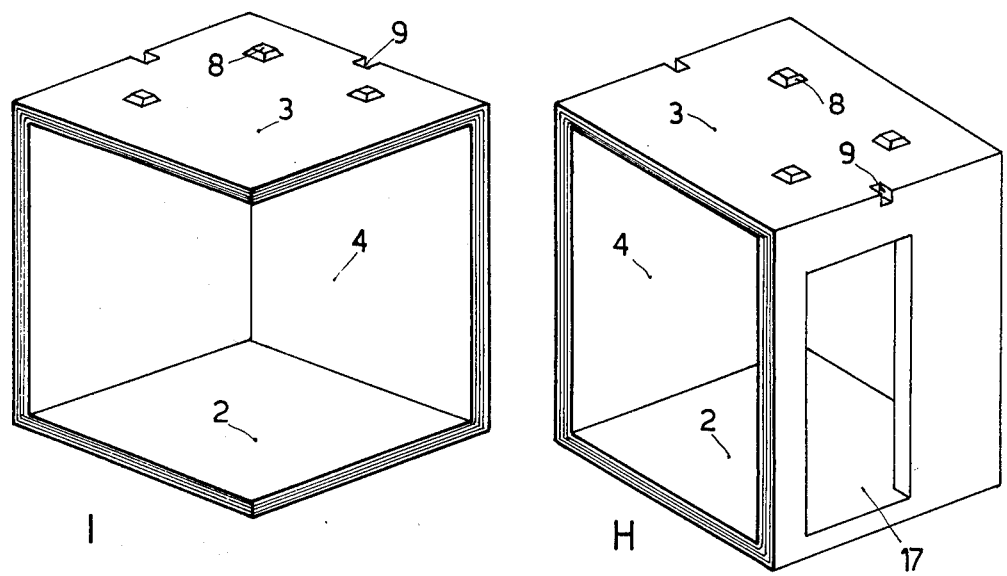
Figure 16:
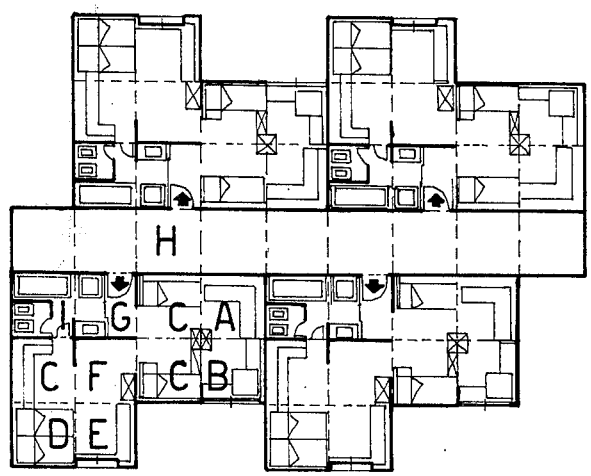
FIG. 16 is a plan view of a multiplicity of habitation units resulting from the assembly of three-dimensional pre-fabricated elements shown in the preceding figures.

FIGS. 12 and 13 show the inside view of two elements designed, respectively, to be portions of a hall with door aperture 17 or external landing, being indicated by the reference letters G and I, shown assembled in FIG. 16.

Figure 18:
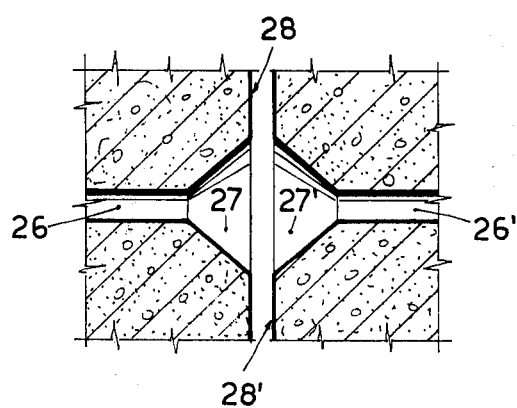
FIG. 18 is a partially sectional view of the connecting portions of the tubular passages for electric wires in the adjacent elements.

All the above mentioned elements can have the ceiling fitted for receiving a conditioning apparatus and the pipes of various distribution systems (for the electrical system see FIG. 18).

The three-dimensional pre-fabricated bathroom element H, shown at FIG. 14, is pre-arranged for housing all sanitary fittings. It also can contain an integral kitchen such as that illustrated at FIG. 19 and described in the following.

The ribs, which are an important feature of the various pre-fabricated elements, are easily and economically obtained through the present known moulding techniques, now allowed by the most recent building materials.

As it appears from the preceding description, the ribs are of two different types: a first one such as the ribs with reference numbers 6 of FIG. 1, 7 of FIG. 3, 11 of FIG. 5, 13 of FIG. 7, and 16 of FIG. 9, for supporting furniture; and a second type generally indicated by numeral 14 at the junction of the ceiling and wall in FIG. 9.

The first type ribs are those which provide support means for differently shaped pieces of furniture and are formed in the wall and floor parts of the pre-fabricated elements. They are preferably in-pressed with no need of thickening the wall or floor cross-section, having no stiffening function, and thus the exterior space defined by said in-pressed ribs can provide channels for receiving pipes and electrical wiring for utilities. As furniture supports, such ribs give a single and convenient solution of the problem of the optimal exploitation of the available space, from both the aesthetical and functional point of view, also affording a sensible saving of furniture.

The stiffening ribs 14 give the structural elements of the invention the feature of being self-supporting, thus allowing that a multistory building can be erected by simply superimposing one on another the parallelepiped structures obtained by mutually engaging fitting means 8 in the seats on the respective elements and fastening groups of four elements together as described.

Figure 17:
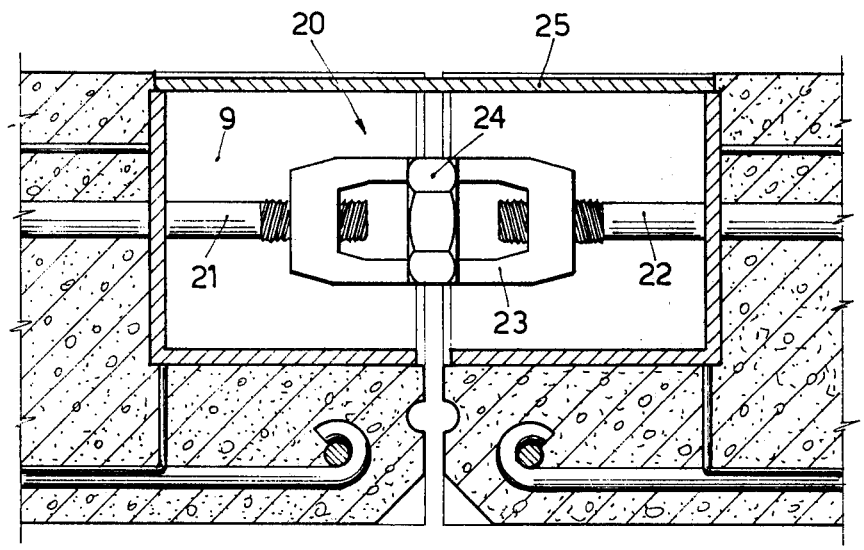
FIG. 17 is a cross-section view of an embodiment of a turnbuckle fastening means between two adjacent elements.

With reference to FIG. 17 there is shown a preferred embodiment of a fastening device forming an element of said interengaging means for conjointly fixing together the structural elements of the invention, adapted to be housed in seats such as the pre-formed recesses 9 of FIGS. 1-14.

The fastening device is in this case a turnbuckle 20 with right and left-hand threaded members 21, 22 partially embedded in the material (reinforced concrete in the figure) of two structural elements designed to be joined together. A conventional turnbuckle yoke 23 has a central portion 24 shaped as a hexagon nut in order to facilitate the screwing of the turnbuckle yoke on the two threaded members and thus the tightening of the two abutting elements together. The space defined by the pre-formed recesses 9 is such as to allow a tool like a wrench to be introduced and operated from the outside. This space may be conveniently closed by a removable cover plate 25, flush with the continguous surface of the element walls.

With reference to FIG. 18 there is shown; with parts broken away, the outer portion of a pair of tubular aligned passages 26 and 26 for electrical wires molded in two abutting structural elements of the invention. The various prefabricated elements have integrally pre-formed therein the necessary passages for the whole electric installation, with current plugs and sockets, whereby it is only necessary to pull wires therethrough and to make the necessary connections in order to have the installation ready-to-use. In order to secure the continuity of the electric connection, the conduits for the wires have to pass from a structural element to at least an adjacent one, abutting therewith to cooperate to form a room. The outlet aperture 27 at each end of passage 26 at the surface 28 of the precast element is substantially in line with the outlet aperture 27' of the corresponding passage 26' at the surface 28' of another precast element to be arranged and secured adjacent to the first element, with the surfaces 28, 28' facing each other.

In order to facilitate the passage of an electric wire from 26 to 26' by simply drawing it at an end, the tubular passages pre-formed in the elements are provided at their outer apertures with funnel-shaped enlargements 27, 27'. Thus, possible entangling and sticking of the wire passing from the tubular passage 26 of a first element to the passage 26' of an adjacent element is avoided.

Figure 19:
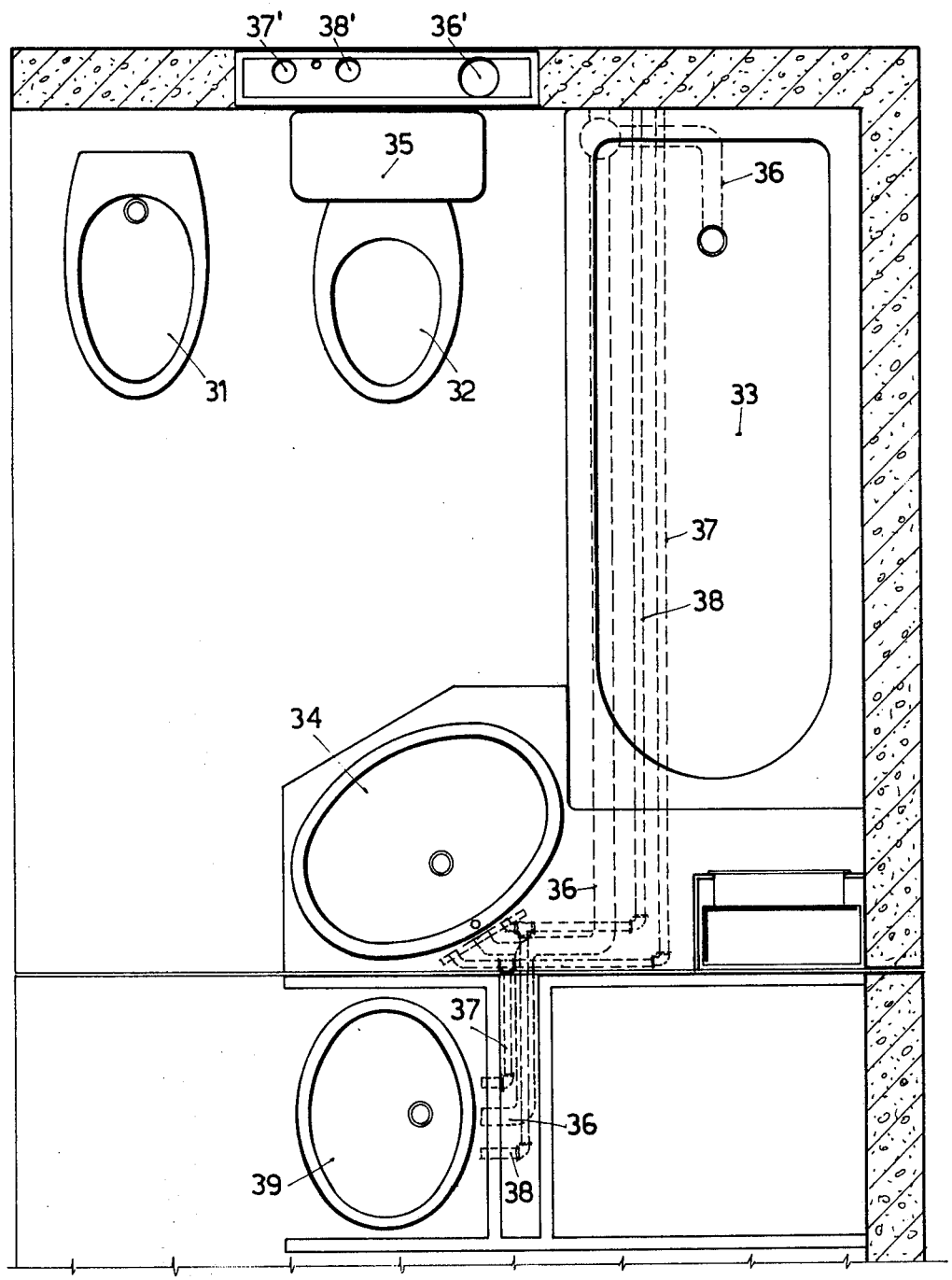
FIG. 19 is a plan view of a structural element having incorporated therein all the sanitary equipments for a bathroom with hydraulic pipes and connections.

With reference to FIG. 19 there is shown in a top plan view with the ceiling section removed, showing an example of a structural element according to the invention, being provided with all the sanitary equipments in place and the necessary hydraulic installations and connections. This type of precast element called elsewhere in this application "hydraulic unit" contains in one-quarter of room all the usual fittings of a bathroom and can be assembled to form a wide bath-room, with any other three elements. Otherwise, as shown in the figure, it may be assembled at least on one side, with a similar element also fitted with hydraulic installation and comprising for example the usual kitchen equipments. In this case it is preferable that a curtain wall, such as a panel 30, is mounted between the bathroom and the kitchen. If this panel is as long as two pre-fabricated elements and two other elements, each with a door aperture, are assembled in the way already described, the group of four elements forms in this case two rooms, i.e., a bath-room and a kitchen separated by a partition wall.

FIG. 19 shows in a "hydraulic unit" element such sanitary fittings as a bidet 31, a flush toilet 32, a bath tub 33 and a wash-basin 34 arranged so that a minimum space is taken up. Within the thickness of a wall a water reservoir 35 for the water-closet is pre-arranged during the precasting of the element. Simultaneously the plumbing pipes may be embedded in the wall or floor thickness, such as the cold and warm water pipes 37, 38 and 37', 38', and the discharge pipes 36, 36'. The necessary connections and pipe fittings are provided for in the contiguous precast elements to make possible the continuity of the hydraulic system, either with the adjacent elements at the same floor, or with the other upper and lower habitation units. For example there are shown the hydraulic connections for a sink 39 in a kitchen mounted in an adjacent element beside a partition panel 30 which is not a part of the pre-fabricated elements, but serves to make two rooms (kitchen and bath-room) by the assembly of four elements.

Such ribs as 6, 7, 11, 13 and 16 of the non-stiffening type, as above described, can also be formed in the ceiling section, be adapted to house therein elements of an air conditioning system or indirect light appliances. In this case, if desired, false ceiling panels may be used.

It is important to point out how easy it is to assemble the described elements and the multiplicity of the various types of room which can be obtained; Furthermore through the adoption of such pre-fabricated elements, it is always possible to effect subsequent structural readaptations and modifications, each room being adapted to be disassembled and transformed by replacement of said certain said pre-fabricated structural elements. Their mounting technique is such that these elements are mutually replaceable, being supported or suspended from fixed central units, such as element H of FIG. 16. or being simply superimposed, placed one on the other with the interengaging means including fitting means 8 in corresponding seats, as they are self-supporting. For example, as a given family grows and more bedrooms are needed, a building can be altered to provide the necessary additional sleeping chambers. Subsequently, when older children depart from the home, former bedrooms can be changed into other, more useful, rooms using the quarter section replacement elements without requiring substantial masonry work in modifying the building.

Figure 15:
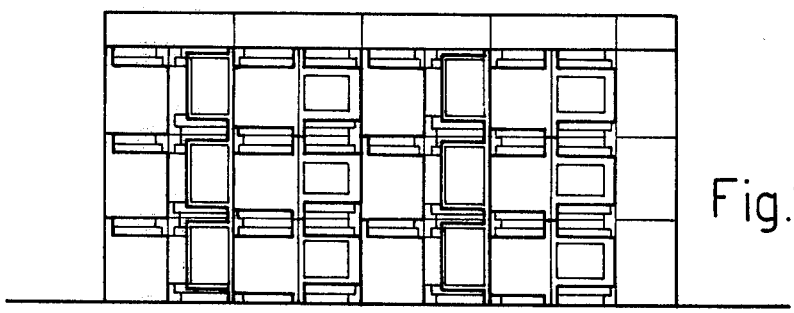
FIG. 15 is an elevation diagrammatic view of an example of assembly of three-dimensional pre-fabricated elements acording to the invention.

Finally through the adoption of three-dimensional pre-fabricated elements of the described and illustrated type, it is possible to transform the present building fabrication yards into highly technological factories, specialized in operations of precasting elements for assemblage, sealing, adjusting and testing, in order to facilitate the production of low-cost houses, such as those represented in FIGS. 15 and 16, which are an example of associated habitation units according to this invention, respectively in elevation and plan device.

Although the present invention has been described in considerable detail with reference to the annexed drawings, representing some preferred embodiments thereof, it should be understood that changes and/or additions can be made without exceeding the scope and the spirit of the invention, as defined by the appended claims.

What I claim is:

1. A three-dimensional, pre-fabricated structural element for building habitation units comprising a plurality of self-supporting, sectional elements adapted to have standard sizes whereby to be assembled with other similar self-supporting elements to form a residential structure; each of said elements including a floor part and a ceiling part with two interposed wall parts formed integrally with said floor and ceiling parts to produce one of said self-supporting, sectional elements; said floor parts and wall parts together defining a generally rectangular space; each of said sections forming a complete self-supporting, standard size one-quarter portion of a conventional residential room; certain of said floor, ceiling and wall parts being integrally formed with stiffening ribs and certain of said wall parts having door and window apertures formed therein, other non-stiffening ribs being provided integral with said floor and wall parts, said other ribs being shaped to provide support means for differently shaped pieces of furniture; pre-formed passages being provided within said parts of an element to form channels for receiving pipes and electrical wiring for utilities; interengaging fitting means including fastenings formed integrally on the outside of said floor, wall and ceiling parts; said one-quarter sectional elements being adapted to be fastened together, in groups of four to form any one of a number of conventional residential rooms; and a plurality of such assembled rooms being adapted to be assembled together to form a residential complex; said interengaging fitting means being adapted to be readily disengaged and re-engaged, said self-supporting standard size elements being constructed and arranged to be selectively fitted together to form said different types of rooms in said residential complex and said individual elements being removable from one assembly and then interchangeable with one another, whereby the residential pattern of rooms may be selectively rearranged and altered as desired.

* * * * *